(12) United States Patent
Matsuo et al.

(10) Patent No.: US 9,224,874 B2
(45) Date of Patent: Dec. 29, 2015

(54) SEMICONDUCTOR STORAGE DEVICE (71) Applicant: KABUSHIKI KAISHA TOSHIBA, Minato-ku (JP)

(72) Inventors: Kazuhiro Matsuo, Yokkaichi (JP); Masayuki Tanaka, Yokkaichi (JP); Masao Shingu, Yokkaichi (JP); Kensei Takahashi, Kuwana (JP); Fumiki Aiso, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/200,854

(22) Filed: Mar. 7, 2014

(65) Prior Publication Data

US 2015/0200307 A1 Jul. 16, 2015

Related U.S. Application Data (60) Provisional application No. 61/925,750, filed on Jan. 10, 2014.

(51) Int. Cl.
*H01L 29/66* (2006.01)
*H01L 29/792* (2006.01)
*H01L 29/51* (2006.01)
*H01L 29/423* (2006.01)

(52) U.S. Cl.
CPC ........ *H01L 29/7926* (2013.01); *H01L 29/4234* (2013.01); *H01L 29/513* (2013.01); *H01L 29/518* (2013.01); *H01L 29/792* (2013.01)

(58) Field of Classification Search
CPC ............ H01L 27/115; H01L 27/11521; H01L 21/28273; H01L 27/105; H01L 27/11526; H01L 27/11582; H01L 27/11556; H01L 29/7926; H01L 27/1157; H01L 2924/0002
See application file for complete search history.

(56) References Cited

U.S. PATENT DOCUMENTS

| | | | |
|---|---|---|---|
| 7,414,285 B2 | 8/2008 | Akahori et al. | |
| 7,651,914 B2 | 1/2010 | Akahori et al. | |
| 8,008,707 B2 | 8/2011 | Matsuo et al. | |
| 2008/0087937 A1 | 4/2008 | Akahori et al. | |
| 2008/0268263 A1* | 10/2008 | Yamazaki | 428/446 |
| 2009/0011586 A1 | 1/2009 | Akahori et al. | |
| 2009/0152618 A1 | 6/2009 | Matsuo et al. | |
| 2010/0062595 A1* | 3/2010 | Lim et al. | 438/591 |
| 2010/0308393 A1 | 12/2010 | Matsuo et al. | |

(Continued)

FOREIGN PATENT DOCUMENTS

| | | |
|---|---|---|
| JP | 2008-98510 A | 4/2008 |
| JP | 2009-147135 A | 7/2009 |
| JP | 2009-170719 A | 7/2009 |

(Continued)

*Primary Examiner* — Tony Tran
(74) *Attorney, Agent, or Firm* — Oblon, McClelland, Maier & Neustadt, L.L.P.

(57) ABSTRACT

A semiconductor storage device according to the present embodiment includes a semiconductor substrate. A tunnel insulating film is provided on the semiconductor substrate. A charge accumulation layer is provided on the tunnel insulating film. An intermediate dielectric film is provided on the charge accumulation layer. A control gate electrode is formed on the intermediate dielectric film. The intermediate dielectric film includes a laminated film of silicon oxide films of multiple layers and silicon nitride films of at least one layer, and a silicon oxynitride film provided between adjacent ones of the silicon oxide films and the silicon nitride films.

7 Claims, 11 Drawing Sheets

(56) References Cited

U.S. PATENT DOCUMENTS

2011/0298039 A1 12/2011 Matsuo et al.
2013/0240978 A1 9/2013 Tanaka et al.

FOREIGN PATENT DOCUMENTS

JP 2010-283127 A 12/2010
JP 2013-197191 A 9/2013

* cited by examiner

SEMICONDUCTOR STORAGE DEVICE

CROSS REFERENCE TO RELATED APPLICATIONS

This application is based upon and claims the benefit of priority from the prior U.S. provisional Patent Application No. 61/925,750, filed on Jan. 10, 2014, the entire contents of which are incorporated herein by reference.

FIELD

The embodiments of the present invention relate to a semiconductor storage device and manufacturing method thereof.

BACKGROUND

In semiconductor storage devices such as a NAND flash memory, memory cells are increasingly downscaled. As the downscaling of memory cells progresses, gaps between adjacent charge accumulation layers become narrower, and it becomes difficult to embed a control gate between the charge accumulation layers. To deal with this problem, it is necessary to make the physical thickness of an IPD (Inter-Poly Dielectric) film between a charge accumulation layer and a control gate thinner.

However, when the IPD film is made thinner, the charge amount de-trapped from the IPD film increases. That is, when the IPD film is made thinner, charges once trapped in the IPD film tend to be easily released to a charge accumulation layer or a control gate. For example, when a positive voltage is applied on a control gate, electrons trapped in the IPD film are pushed out to the control gate. Changes of the charge amount within the IPD film affect the threshold voltage of memory cells. Therefore, if charges are trapped in the IPD film, it is not preferable that the charges are de-trapped from the IPD film. It is needless to mention that if the charge amount trapped in the IPD film is decreased, the charge amount de-trapped from the IPD film is also decreased.

Meanwhile, charges to be trapped in the IPD film relax an electric field caused in the IPD film at the time of data writing and reduce a leakage current. Accordingly, the charges prevent electrons from leaking from a floating gate and maintain write saturation.

Therefore, it has been desired that leakage of electrons is suppressed while decreasing charges trapped in an IPD film and/or charges de-trapped from the IPD film even if the IPD film is made thinner.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a substrate on which semiconductor elements are provided is assumed as "an upper direction". Therefore, the term "upper direction" or "lower direction" occasionally differs from an upper direction or a lower direction based on a gravitational acceleration direction.

A semiconductor storage device according to the present embodiment includes a semiconductor substrate. A tunnel insulating film is provided on the semiconductor substrate. A charge accumulation layer is provided on the tunnel insulating film. An intermediate dielectric film is provided on the charge accumulation layer. A control gate electrode is formed on the intermediate dielectric film. The intermediate dielectric film includes a laminated film of silicon oxide films of multiple layers and silicon nitride films of at least one layer, and a silicon oxynitride film provided between adjacent ones of the silicon oxide films and the silicon nitride films.

A NAND flash memory having a two-dimensional structure or a three-dimensional structure can be mentioned as an example of the semiconductor storage device according to the present embodiment. However, the present embodiment is not limited to NAND flash memories, and can be applied to other types of semiconductor storage devices.

First Embodiment

Figure 1:
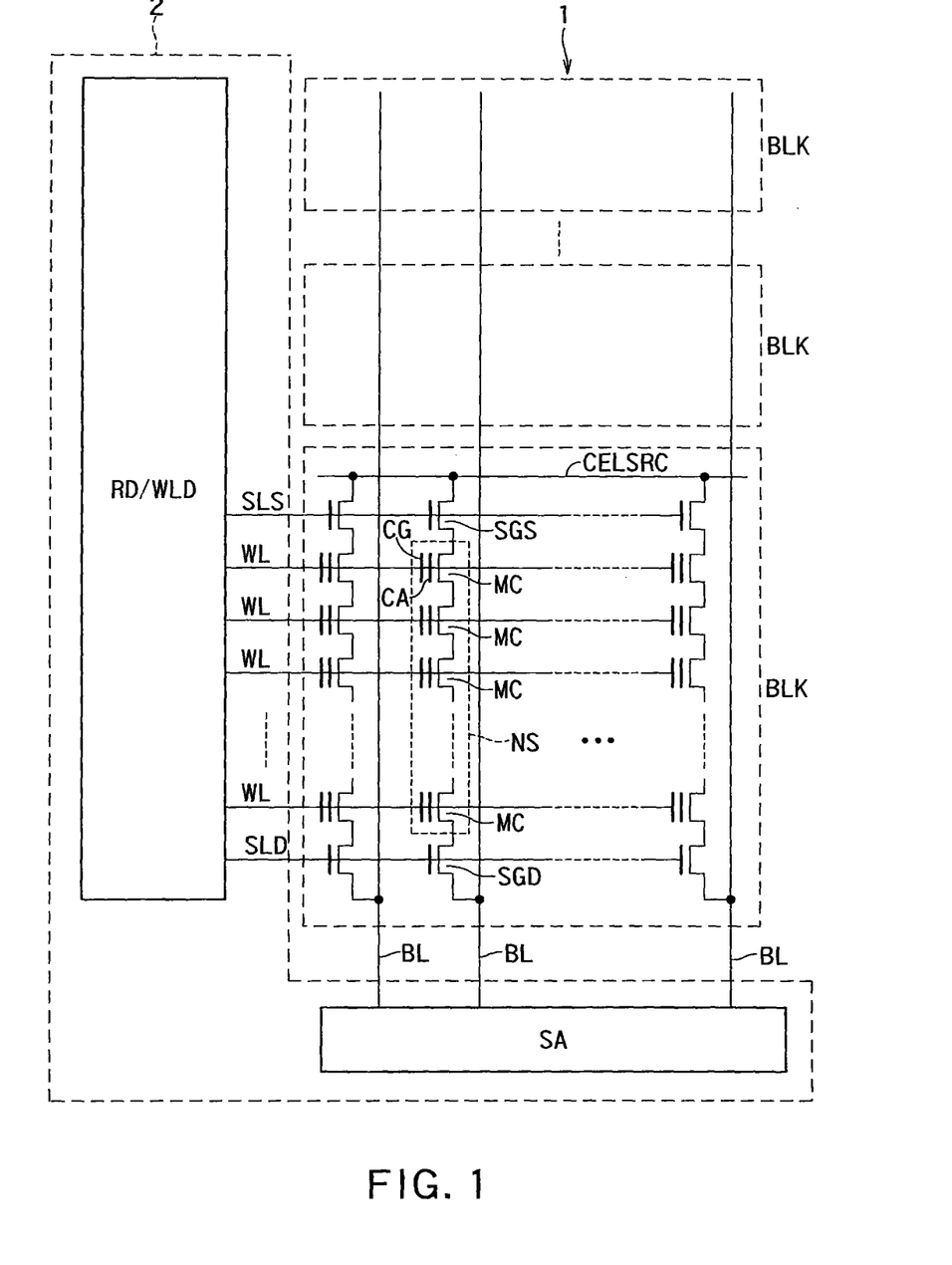
FIG. 1 shows an example of a configuration of a semiconductor storage device according to a first embodiment.

FIG. 1 shows an example of a configuration of a semiconductor storage device according to a first embodiment. For example, the semiconductor storage device is a NAND flash memory (hereinafter, also simply "memory"). The memory includes a memory area 1 in which a plurality of memory cells MC are two-dimensionally arranged in matrix and a peripheral circuit area 2 that controls the memory area 1.

The memory area 1 includes a plurality of blocks BLK, and each of the blocks BLK includes a plurality of NAND strings NS. The blocks BLK are a unit of data erasure. The NAND string NS includes a plurality of series-connected memory cells MC. Memory cells MC at both ends of the NAND string NS are respectively connected to selective gate transistors SGD and SGS. The memory cell MC at one end of the memory area 1 is connected to bit lines BL via the selective gate transistor SGD, and the memory cell MC at the other end is connected to a cell source CELSRC via the selective gate transistor SGS.

A word line WL is connected to a control gate CG of the memory cell MC arranged in a row direction. Selective gate lines SLD and SLS are respectively connected to gates of the selective gate transistors SGD and SGS. The word line WL and the selective gate lines SLS and SLD are driven by a row decoder RD and a word line driver WLD.

Respective bit lines BL are connected to the NAND string NS via the selective gate transistor SGD. Furthermore, the respective bit lines BL are connected to a sense amplifier circuit SA. A plurality of memory cells MC connected to one word line WL constitute a page, which is a unit of data reading or data writing in a batch.

As the selective gate lines SLS and SLD drive the selective gate transistors SGS and SGD, the NAND string NS is connected between the bit line BL and the cell source CELSRC. Subsequently, as a word line driver WLD drives an unselective word line WL, an unselective memory cell MC is set to an ON state. With this process, the sense amplifier SA can apply a voltage on a selective memory cell MC via the bit line BL. With this configuration, the sense amplifier SA can detect data of the selective memory cell MC or can write data in the selective memory cell MC. The memory cell MC has a threshold voltage that depends on a charge amount (an electron amount) accumulated in a charge accumulation layer CA. The sense amplifier SA detects differences in threshold voltages of the memory cells MC and determines the logic of data.

Figure 2:
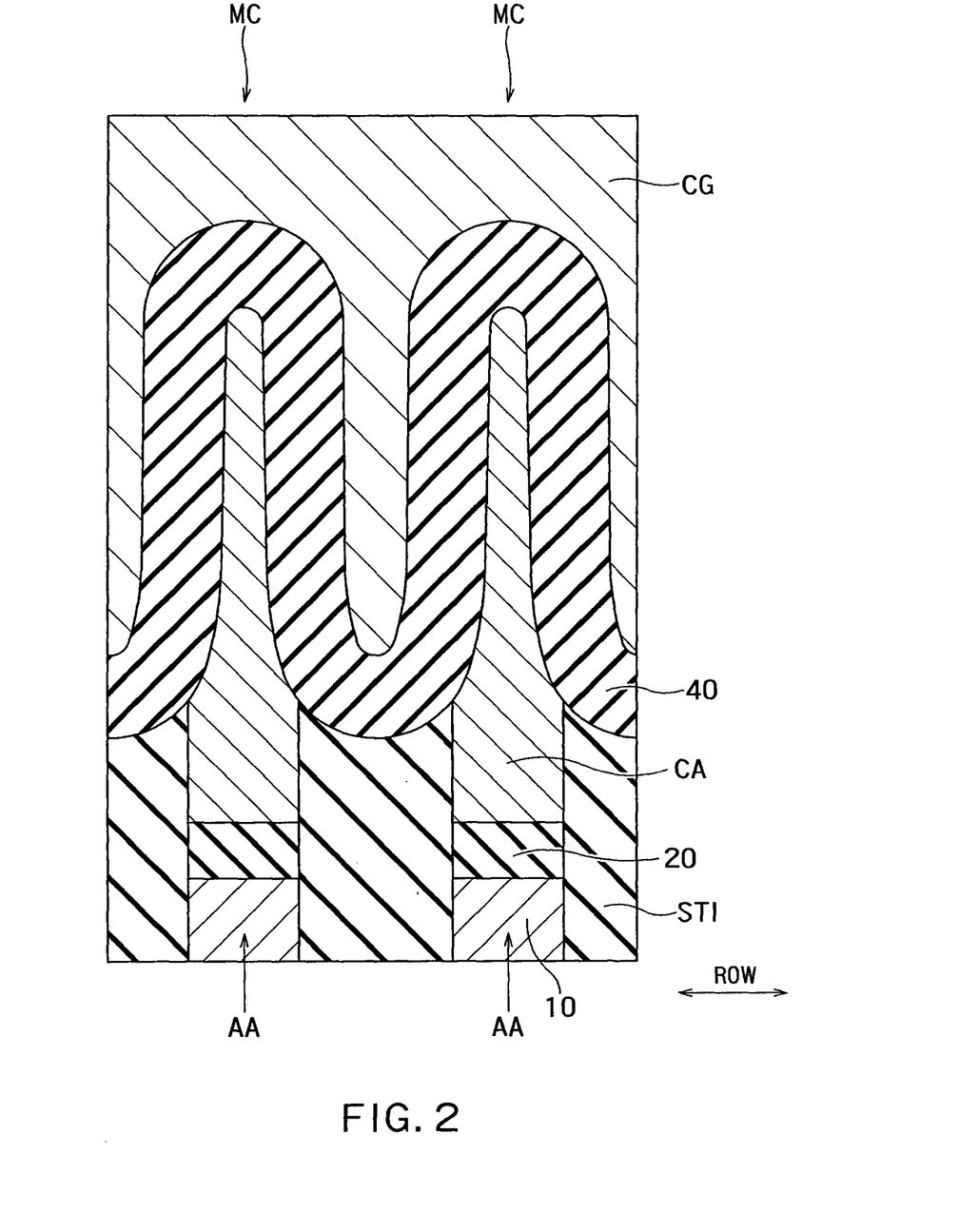
FIG. 2 is a cross-sectional view showing an example of a configuration of the memory cell MC according to the first embodiment.

FIG. 2 is a cross-sectional view showing an example of a configuration of the memory cell MC according to the first embodiment. The memory cell MC includes a substrate 10, a tunnel insulating film 20, the charge accumulation layer CA, an intermediate dielectric film (so-called "IPD film") 40, and the control gate CG. A diffusion layer provided on the substrate 10 is omitted in FIG. 2.

The substrate 10 is, for example, a semiconductor substrate such as a silicon substrate. AA denotes an active area arranged on the substrate 10. STI (Shallow Trench Isolation) represents an element isolation region. The element isolation region STI is provided between adjacent active areas AA in an extending direction (a row direction) of the word line WL. With this configuration, the memory cell MC provided in the adjacent active areas AA in the row direction is electrically isolated by the STI.

The tunnel insulating film 20 is provided on the substrate 10. The tunnel insulating film 20 is formed using, for example, an insulating film such as a silicon insulating film. The charge accumulation layer CA is provided on the tunnel insulating film 20. The charge accumulation layer CA is formed using, for example, a material such as doped polysilicon or a silicon nitride film.

The charge accumulation layer CA accumulates charges (such as electrons) from the substrate 10 via the tunnel insulating film 20, or discharges the charges to the substrate 10 via the tunnel insulating film 20. With this process, the threshold voltage of the memory cell MC changes and logical data is stored in the memory cell MC.

The intermediate dielectric film 40 is provided on the charge accumulation layer CA. The intermediate dielectric film 40 is formed using, for example, a laminated film of a silicon oxide film, a silicon nitride film, and a silicon oxynitride film. The silicon oxynitride film is provided on either one of interfaces of the laminated silicon oxide film or the silicon nitride film. That is, the silicon oxynitride film is provided between adjacent ones of the silicon oxide film and the silicon nitride film. More detailed structure of the intermediate dielectric film 40 is explained later.

The control gate CG is provided on the intermediate dielectric film 40. The control gate CG is formed using, for example, tungsten or a conductive material such as a tungsten nitride film.

Figure 3A:
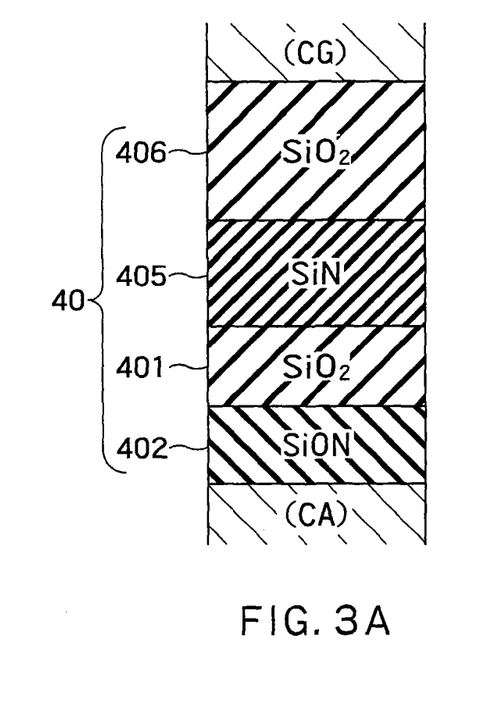
FIGS. 3A and 3B are sectional views showing more detailed structures of the intermediate dielectric film 40 according to the first embodiment.
Figure 3B:
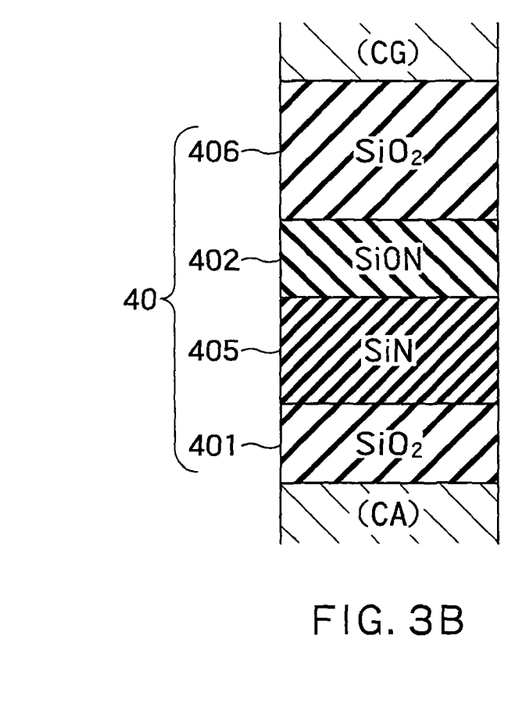

FIGS. 3A and 3B are sectional views showing more detailed structures of the intermediate dielectric film 40 according to the first embodiment.
(Intermediate Dielectric Film 40 Shown in FIG. 3A)

In FIG. 3A, the intermediate dielectric film 40 includes a silicon oxide film 401, a silicon oxynitride film 402, a silicon nitride film 405, and a silicon oxide film 406. The silicon oxynitride film 402 is provided on the charge accumulation layer CA. The silicon oxide film 401 is provided on the silicon oxynitride film 402. The silicon nitride film 405 is provided on the silicon oxide film 401. The silicon nitride film 405 can be a high dielectric film such as $Al_2O_3$ or $HfO_2$. The silicon oxide film 406 is provided on the silicon nitride film 405. That is, when the silicon oxide film is denoted as "O" and the silicon nitride film is denoted as "N", the intermediate dielectric film 40 has a structure of an ONO film. Furthermore, the silicon oxynitride film 402 is interposed between the silicon oxide film 401 on the side of the charge accumulation layer CA and the charge accumulation layer CA.

The nitrogen content and leakage characteristics of the silicon oxynitride film 402 are explained below.

Figure 4:
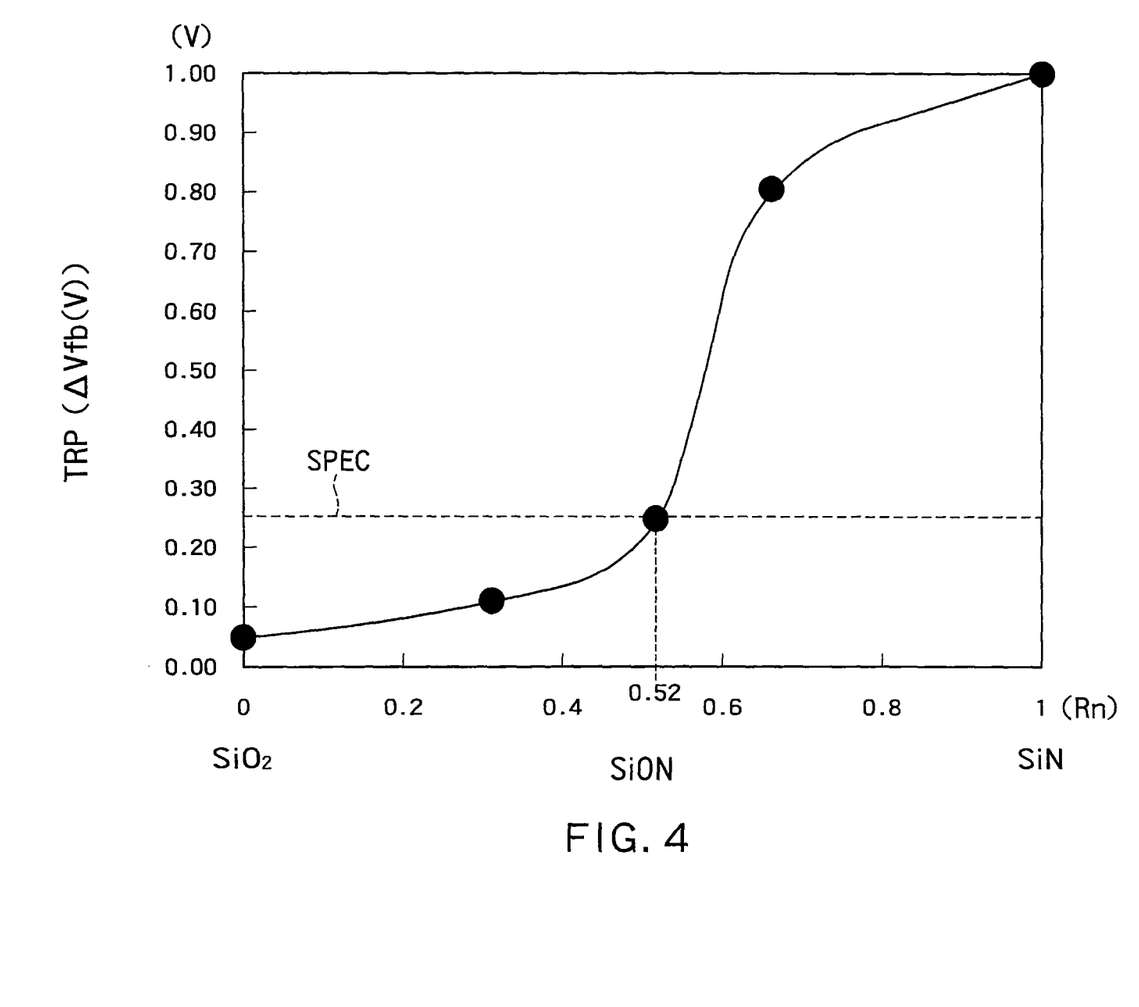
FIG. 4 is a graph showing a relationship between a nitrogen content of a silicon oxide film, a silicon nitride film, or a silicon oxynitride film and a trapped charge amount TRP.

FIG. 4 is a graph showing a relationship between a nitrogen content of a silicon oxide film, a silicon nitride film, or a silicon oxynitride film and a trapped charge amount TRP. The trapped charge amount TRP is an amount of charges trapped in a silicon oxide film, a silicon nitride film, or a silicon oxynitride film. The graph of FIG. 4 shows a trapped charge amount in a case where a high electrical field is applied for a predetermined period of time on a sample of a silicon oxide film, a silicon nitride film, or a silicon oxynitride film.

A nitrogen content Rn is a ratio of a nitrogen content with respect to a total content of oxygen and nitrogen. To be more specific, when the oxygen content of a silicon oxynitride film is denoted as CNTo and the nitrogen content of the silicon oxynitride film is denoted as CNTn, a nitrogen content Rc can be expressed by CNTn/(CNTo+CNTn). In FIG. 4, the nitrogen content Rn is shown on the horizontal axis.

As shown in FIG. 4, as the nitrogen content Rn of the silicon oxynitride film decreases, the trapped charge amount TRP decreases significantly. For example, the nitrogen content Rn of a silicon nitride film SiN becomes substantially 1. In this case, the charge amount TRP trapped in the silicon nitride film SiN is very large. On the other hand, the nitrogen content Rn of a silicon oxide film $SiO_2$ becomes substantially 0. In this case, as shown in FIG. 4, the charge amount TRP trapped in the silicon oxide film $SiO_2$ is very small. As the nitrogen content Rn of a silicon oxynitride film SiON decreases, the trapped charge amount TRP also decreases significantly.

In the case of FIG. 4, the standard value of the trapped charge amount TRP is approximately equal to or lower than 0.25 V, which is a range that does not cause any influences on devices. Therefore, it is understood that, when the nitrogen content Rn is equal to or lower than 0.52, the trapped charge amount TRP of the silicon oxynitride film SiON is within the standard value. That is, in order to have the trapped charge amount TRP within the standard value, it is only necessary to set the nitrogen content Rn of the silicon oxynitride film to be equal to or lower than 0.52.

Figure 5:
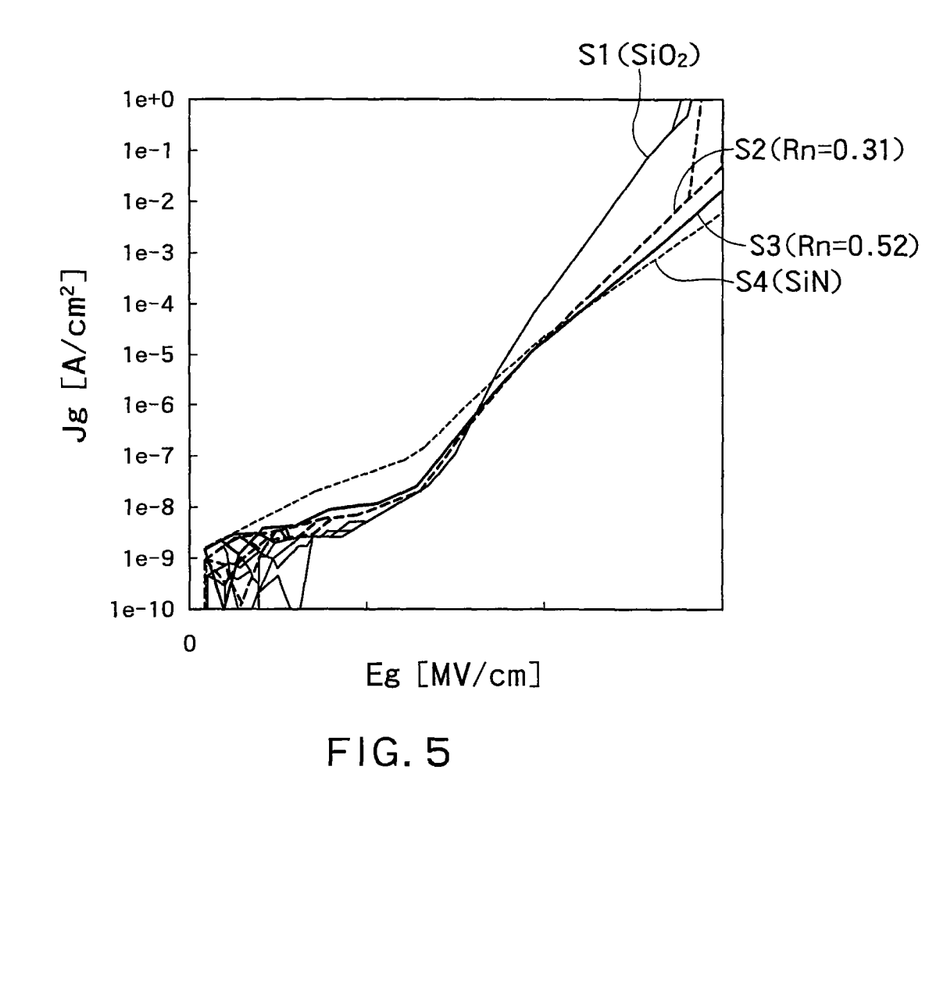
FIG. 5 is a graph showing a leakage current Jg of a silicon oxynitride film.

FIG. 5 is a graph showing a leakage current Jg of a silicon oxynitride film. In FIG. 5, the horizontal axis represents a gate voltage and the vertical axis represents a leakage current amount. The sample of FIG. 5 is a structure in which a polysilicon electrode is provided on both sides of a laminated film having a silicon oxide film, a silicon nitride film, or a silicon oxynitride film interposed between a silicon oxide film and a silicon nitride film. The polysilicon electrode functions as a gate electrode or a floating gate. In the experiment of FIG. 5, a voltage was applied between polysilicon electrodes and a leakage current passing the sample was measured.

In a sample S1, a silicon oxide film (Rn=0) is arranged between a silicon oxide film and a silicon nitride film. In samples S2 and S3, a silicon oxynitride film is arranged between a silicon oxide film and a silicon nitride film. The nitrogen content Rn of the sample S2 is 0.31. The nitrogen content Rn of the sample S3 is 0.52. In a sample S4, a silicon nitride film (Rn=1) is arranged between a silicon oxide film and a silicon nitride film. Physical thicknesses of the samples S1 to S4 are equal.

As a result of experiments, as shown in FIG. 5, the leakage current decreases in the order of the samples S1, S2, S3, and S4. The leakage currents of the samples S2 to S4 are lower than the leakage current of the sample S1 by one order of magnitude. That is, by interposing a silicon oxynitride film between a silicon oxide film and a silicon nitride film, the leakage current can be decreased by one or more orders of magnitude without changing the physical thickness. Furthermore, if the nitrogen content Rn is equal to or higher than 0.31, it is understood that the leakage current is sufficiently low. In this way, by providing the silicon oxynitride film 402 on the intermediate dielectric film 40, the leakage current can be decreased while maintaining the physical thickness to be small.

As can be understood from FIGS. 4 and 5, by interposing the silicon oxynitride film 402 having the nitrogen content Rn equal to or lower than 0.52 between a silicon oxide film and a silicon nitride film, the trapped charge amount TRP can be decreased while suppressing increase of the leakage current.

Referring back to FIG. 3A, the silicon oxynitride film 402 is interposed between the silicon oxide film 401 and the charge accumulation layer CA. That is, the silicon oxynitride film 402 is arranged on an interface on the side of the charge accumulation layer CA in an ONO film. With this arrangement, in a data writing operation, the intermediate dielectric film 40 can suppress leakage of charges (such as electrons) from the charge accumulation layer CA to the silicon nitride film 405 and can prevent the charges from being trapped in the silicon nitride film 405. Furthermore, because the nitrogen content Rn of the silicon oxynitride film 402 is equal to or lower than 0.52, it is possible to prevent the charges from being trapped in the silicon oxynitride film 402 itself. Further, because the amount of the charges trapped in the silicon nitride film 405 shown in FIG. 3A is decreased, it is possible to prevent the charges from being de-trapped from the silicon nitride film 405 to the charge accumulation layer CA at the time of charge retention.

As described above, by including the silicon oxynitride film 402, the intermediate dielectric film 40 shown in FIG. 3A can prevent charges from being trapped in the silicon nitride film 405 and the silicon oxynitride film 402 in a data writing operation. At the same time, the intermediate dielectric film 40 can prevent the charges from being de-trapped from the silicon nitride film 405 at the time of charge retention.
(Intermediate Dielectric Film 40 Shown in FIG. 3B)

The intermediate dielectric film 40 shown in FIG. 3B includes the silicon oxynitride film 402 between the silicon nitride film 405 and the silicon oxide film 406. That is, when the silicon oxide film is denoted as "O" and the silicon nitride film is denoted as "N", the silicon oxynitride film 402 is interposed on an interface between "N" and "O" on the side of the control gate CG. Other parts of the structure of the intermediate dielectric film 40 shown in FIG. 3B can be identical to those of the structure of the intermediate dielectric film 40 shown in FIG. 3A.

The nitrogen content and leakage characteristics of the silicon oxynitride film 402 are as explained above with reference to FIGS. 4 and 5.

In FIG. 3B, the silicon oxynitride film 402 is interposed between the silicon nitride film 405 and the silicon oxide film 406. That is, the silicon oxynitride film 402 is arranged on an interface between "N" and "O" on the side of the control gate CG in an ONO film. With this arrangement, in a data writing operation, the intermediate dielectric film 40 suppresses leakage of charges to the control gate CG via the silicon nitride film 405. Furthermore, the silicon oxynitride film 402 shown in FIG. 3B can prevent charges from being de-trapped from the silicon nitride film 405 to the control gate CG at the time of charge retention. Furthermore, because the nitrogen content Rn of the silicon oxynitride film 402 is equal to or lower than 0.52, it is also possible to prevent the charges from being trapped in the silicon oxynitride film 402 itself.

As described above, by including the silicon oxynitride film 402, the intermediate dielectric film 40 shown in FIG. 3B can prevent charges from being trapped in the silicon nitride film 405 at the time of charge retention. At the same time, in a data writing operation, the intermediate dielectric film 40 can suppress leakage of the charges to the control gate CG via the silicon nitride film 405.

Respective intermediate dielectric films 40 shown in FIGS. 3A and 3B can be combined with each other. That is, the intermediate dielectric film 40 can include the silicon oxynitride film 402 on both interfaces, which are an interface between "O" and "N" at the side of the charge accumulation layer CA in an ONO film and an interface between "N" and "O" at the side of the control gate CG. With this arrangement, both effects described with reference to FIGS. 3A and 3B can be obtained.

Second Embodiment

FIGS. 6A to 6D are sectional views showing more detailed structures of the intermediate dielectric film 40 according to a second embodiment. Configurations of the second embodiment other than those shown in FIG. 6 can be identical to corresponding ones of the first embodiment.
(Intermediate Dielectric Film 40 Shown in FIG. 6A)

Figure 6A:
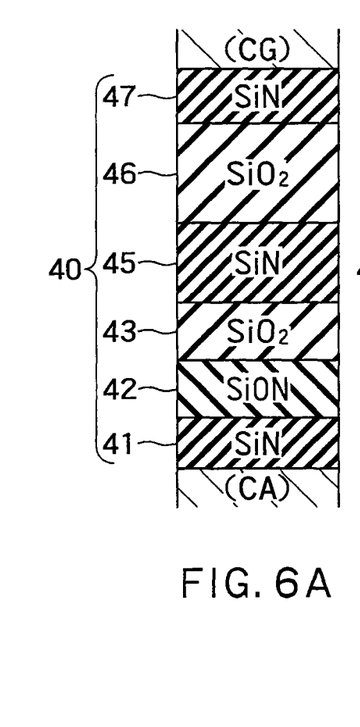
FIGS. 6A to 6D are sectional views showing more detailed structures of the intermediate dielectric film 40 according to a second embodiment.

In FIG. 6A, the intermediate dielectric film 40 includes a silicon nitride film 41, a silicon oxynitride film 42, a silicon oxide film 43, a silicon nitride film 45, a silicon oxide film 46, and a silicon oxide film 47. The silicon nitride film 41 is arranged on the charge accumulation layer CA. The silicon oxynitride film 42 is arranged on the silicon nitride film 41. The silicon oxide film 43 is arranged on the silicon oxynitride film 42. The silicon nitride film 45 is arranged on the silicon oxide film 43. The silicon oxide film 46 is arranged on the silicon nitride film 45. The silicon oxide film 47 is arranged on the silicon oxide film 46. That is, when the silicon oxide film is denoted as "O" and the silicon nitride film is denoted as "N", the intermediate dielectric film 40 has a structure of an NONON film. Furthermore, the silicon oxynitride film 42 is interposed between the silicon nitride film 41 on the side of the charge accumulation layer CA and the silicon oxide film 43.

The nitrogen content and leakage characteristics of the silicon oxynitride film 42 can be identical to those of the silicon oxynitride film 402 according to the first embodiment.

In FIG. 6A, the silicon oxynitride film 42 is interposed between the silicon nitride film 41 and the silicon oxide film 43. That is, the silicon oxynitride film 42 is arranged on an interface between "N" and "O" that are closest to the charge accumulation layer CA in the NONON film. With this arrangement, in a data writing operation, it is possible to suppress leakage of charges (such as electrons) from the charge accumulation layer CA to the silicon nitride film 45, and to prevent the charges from being trapped in the silicon nitride film 45. Furthermore, because the nitrogen content Rn of the silicon oxynitride film 402 is equal to or lower than 0.52, it is also possible to prevent the charges from being trapped in the silicon oxynitride film 42 itself.

Figure 6B:
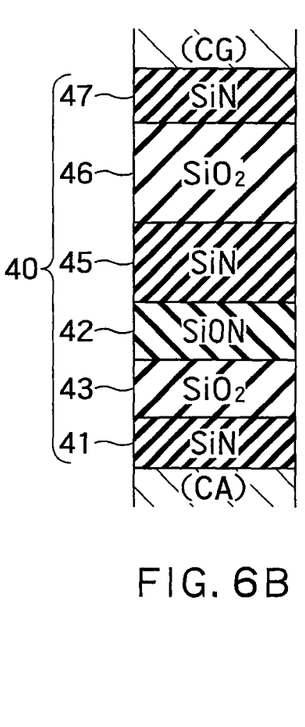

(Intermediate Dielectric Film 40 Shown in FIG. 6B)

The intermediate dielectric film 40 shown in FIG. 6B includes the silicon oxynitride film 42 between the silicon oxide film 43 and the silicon nitride film 45. That is, when the silicon oxide film is denoted as "O" and the silicon nitride film is denoted as "N", the silicon oxynitride film 42 is interposed on an interface between "O" and "N" that are second closest to the charge accumulation layer CA. Other parts of the structure of the intermediate dielectric film 40 shown in FIG. 6B can be identical to those of the structure of the intermediate dielectric film 40 shown in FIG. 6A.

In FIG. 6B, the silicon oxynitride film 42 is interposed between the silicon oxide film 43 and the silicon nitride film 45. Furthermore, the silicon oxynitride film 42 is adjacent to a surface on the side of the charge accumulation layer CA of the silicon nitride film 45. With this configuration, in a data writing operation or at the time of data retention, it is possible to prevent charges from being de-trapped from the silicon nitride film 45 to the charge accumulation layer CA.

Figure 6C:
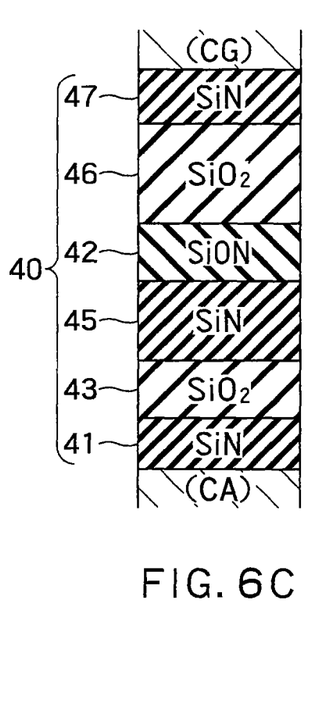

(Intermediate Dielectric Film 40 Shown in FIG. 6C)

The intermediate dielectric film 40 shown in FIG. 6C includes the silicon oxynitride film 42 between the silicon nitride film 45 and the silicon oxide film 46. That is, when the silicon oxide film is denoted as "O" and the silicon nitride film is denoted as "N", the silicon oxynitride film 42 is interposed on an interface between "N" and "O" that are second closest to the control gate CG. Other parts of the structure of the intermediate dielectric film 40 shown in FIG. 6C can be identical to those of the structure of the intermediate dielectric film 40 shown in FIG. 6A.

In FIG. 6C, the silicon oxynitride film 42 is interposed between the silicon nitride film 45 and the silicon oxide film 46. Furthermore, the silicon oxynitride film 42 is adjacent to a surface on the side of the control gate CG of the silicon nitride film 45. With this configuration, in a data writing operation or at the time of data retention, it is possible to prevent charges from being de-trapped from the silicon nitride film 45 to the control gate CG.

Figure 6D:
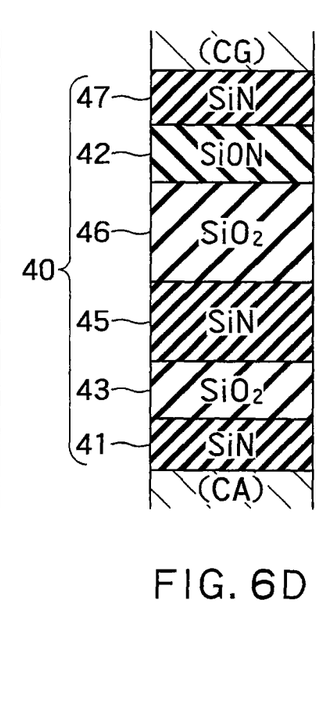

(Intermediate Dielectric Film 40 Shown in FIG. 6D)

The intermediate dielectric film 40 shown in FIG. 6D includes the silicon oxynitride film 42 between the silicon oxide film 46 and the silicon oxide film 47. That is, when the silicon oxide film is denoted as "O" and the silicon nitride film is denoted as "N", the silicon oxynitride film 42 is interposed on an interface between "N" and "O" that are closest to the control gate CG. Other parts of the structure of the intermediate dielectric film 40 shown in FIG. 6D can be identical to those of the structure of the intermediate dielectric film 40 shown in FIG. 6A.

In FIG. 6D, the silicon oxynitride film 42 is interposed between the silicon oxide film 46 and the silicon oxynitride film 47. With this configuration, in a data writing operation, it is possible to suppress leakage of charges from the control gate CG to the silicon nitride film 45, and to prevent the charges from being trapped in the silicon nitride film 45. Furthermore, because the nitrogen content Rn of the silicon oxynitride film 42 is equal to or lower than 0.52, it is also possible to prevent the charges from being trapped in the silicon oxynitride film 42 itself.

Respective intermediate dielectric films 40 shown in FIGS. 6A to 6D can be combined with each other. That is, the intermediate dielectric film 40 can be provided on an interface between a plurality of "O"s and "N"s (or "N"s and "O"s) in an NONON film. With this configuration, functions explained with reference to FIGS. 6A to 6D can be combined with each other.

(First Modification)

The nitrogen content Rn of the silicon oxynitride film 402 according to the first embodiment or that of the silicon oxynitride film 42 according to the second embodiment is decreased from a silicon nitride film adjacent to one side of the silicon oxynitride film 402 or 42 to a silicon oxide film adjacent to the other side thereof in a gradual or stepwise manner. Other configurations of the first modification can be identical to corresponding ones of the first or second embodiment.

Figure 7A:
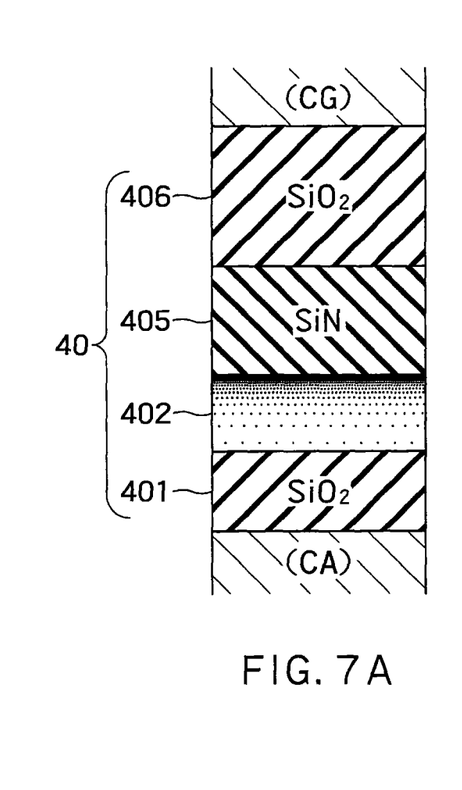
FIGS. 7A and 7B show examples of a structure of the silicon oxynitride film 402 in which the nitrogen content Rn thereof gradually changes.
Figure 7B:
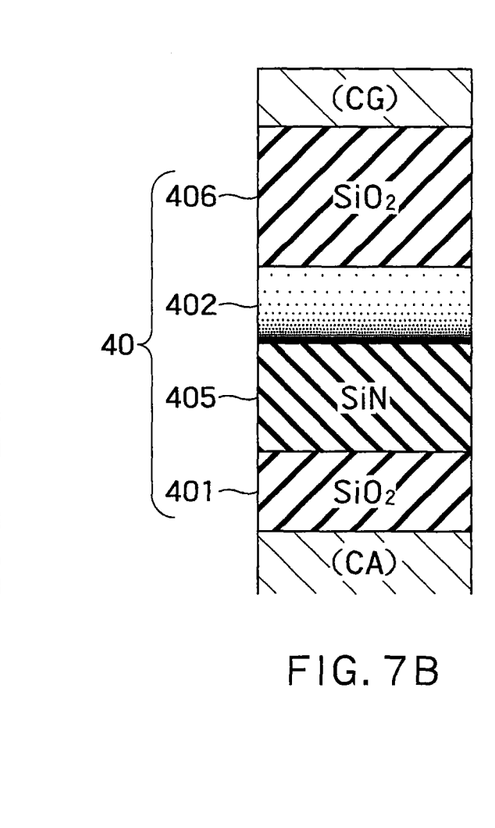

For example, FIGS. 7A and 7B show examples of a structure of the silicon oxynitride film 402 in which the nitrogen content Rn thereof gradually changes. While FIGS. 7A and 7B show the intermediate dielectric film 40 that respectively corresponds to the intermediate dielectric film 40 shown in FIGS. 3A and 3B, the silicon oxynitride film 402 according to the present modification is also applicable to the silicon oxynitride film 42 of the intermediate dielectric film 40 shown in other drawings.

The nitrogen content Rn of the silicon oxynitride film 402 shown in FIG. 7A is approximately 0 (zero) on an interface adjacent to the silicon oxide film 401, and is approximately 0.52 on an interface adjacent to the silicon nitride film 405. In the middle of the silicon oxynitride film 402, the nitrogen content Rn gradually decreases from the silicon nitride film 405 to the silicon oxide film 401.

The nitrogen content Rn of the silicon oxynitride film 402 shown in FIG. 7B is approximately 0 on an interface adjacent to the silicon oxide film 406, and is approximately 0.52 on an interface adjacent to the silicon nitride film 405. In the middle of the silicon oxynitride film 402, the nitrogen content Rn gradually decreases from the silicon nitride film 405 to the silicon oxide film 406. That is, the nitrogen content Rn of the silicon oxynitride film 402 shown in FIG. 7B gradually decreases as the position of the silicon oxynitride film 402 becomes farther from the substrate 10.

Figure 8A:
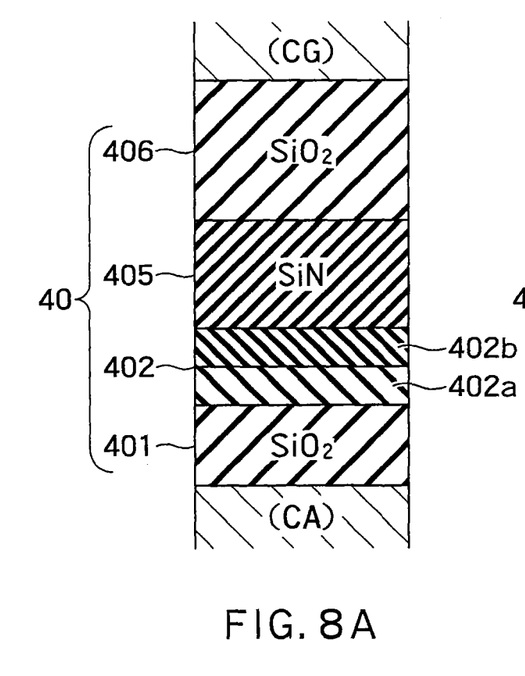
FIGS. 8A and 8B show examples of a structure of the silicon oxynitride film 402 in which the nitrogen content Rn thereof changes in a stepwise manner.
Figure 8B:
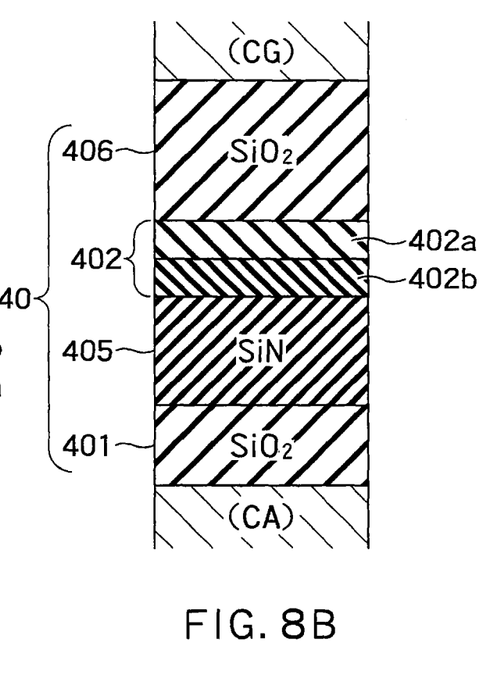

For example, FIGS. 8A and 8B show examples of a structure of the silicon oxynitride film 402 in which the nitrogen content Rn thereof changes in a stepwise manner. Respective silicon oxynitride films 402 shown in FIGS. 8A and 8B are also applicable to the silicon oxynitride film 42 of the intermediate dielectric film 40 shown in other drawings.

The nitrogen content Rn of the silicon oxynitride film 402 shown in FIG. 8A is, for example, approximately 0.4 in a part 402a that is adjacent to the silicon oxide film 401, and is, for example, approximately 0.52 in a part 402b that is adjacent to the silicon nitride film 405. Between the parts 402a and 402b, the nitrogen content Rn decreases in a stepwise manner from, for example, approximately 0.52 to approximately 0.4, from the silicon nitride film 405 to the silicon oxide film 401.

The nitrogen content Rn of the silicon oxynitride film 402 shown in FIG. 8B is, for example, approximately 0.4 in the part 402a that is adjacent to the silicon oxide film 406, and is, for example, approximately 0.52 in the part 402b that is adjacent to the silicon nitride film 405. Between the parts 402a and 402b, the nitrogen content Rn decreases in a stepwise manner from, for example, approximately 0.52 to approximately 0.4, from the silicon nitride film 405 to the silicon oxide film 406.

As described above, by changing the nitrogen content Rn of the silicon oxynitride film 402 or that of the silicon oxynitride film 42 in a gradual or stepwise manner, the length of directly tunneling charges (such as electrodes) is further increased. Accordingly, in a data writing operation, in a data erasing operation, or at the time of data retention, it is possible to achieve enhancement of leakage characteristics and to prevent charge trapping or charge de-trapping more effectively.

(Second Modification)

Figure 9A:
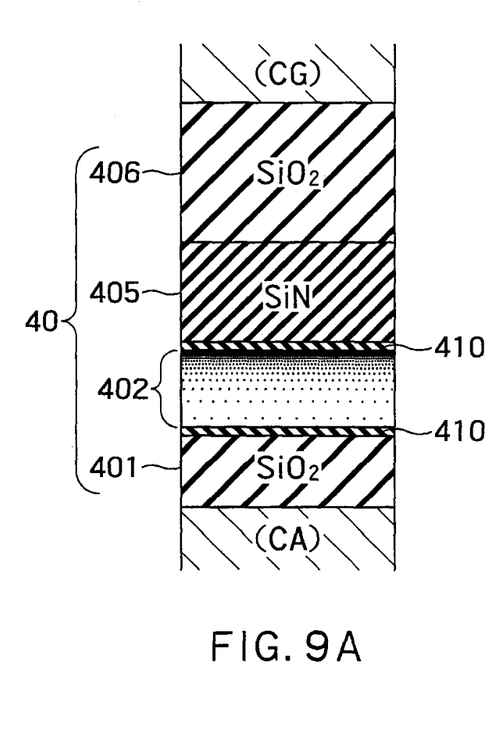
FIGS. 9A and 9B show examples of a structure of the intermediate dielectric film 40 having an aluminum oxide film 410 on interfaces on both sides of the silicon oxynitride film 402.
Figure 9B:
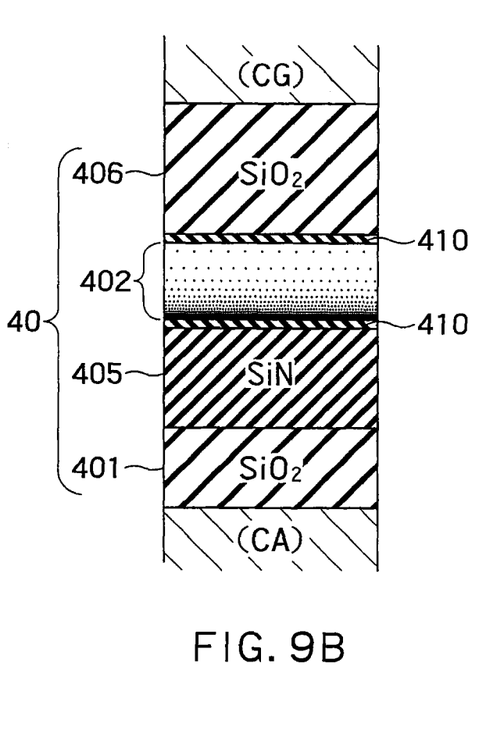

FIGS. 9A and 9B show examples of a structure of the intermediate dielectric film 40 having an aluminum oxide film 410 on interfaces on both sides of the silicon oxynitride film 402. In FIG. 9A, the aluminum oxide film 410 is arranged on an interface between the silicon oxynitride film 402 and the silicon oxide film 401, and on an interface between the silicon oxynitride film 402 and the silicon nitride film 405. In FIG. 9B, the aluminum oxide film 410 is arranged on an interface between the silicon oxynitride film 402 and the silicon oxide film 406, and on an interface between the silicon oxynitride film 402 and the silicon nitride film 405. Configurations of the second modification other than those shown in FIG. 9 can be identical to corresponding ones of the first and second embodiments or of the first modification.

Figure 10:
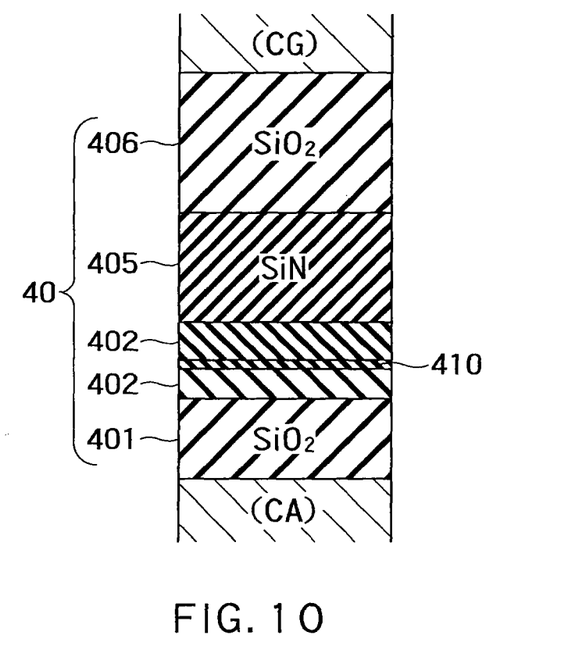
FIG. 10 shows an example of a structure of the intermediate dielectric film 40 having the aluminum oxide film 410 in an intermediate part of the silicon oxynitride film 402.

FIG. 10 shows an example of a structure of the intermediate dielectric film 40 having the aluminum oxide film 410 in an intermediate part of the silicon oxynitride film 402. Configurations of the second modification other than that shown in FIG. 10 can be identical to corresponding ones of the first and second embodiments or of the first modification.

It is known that a leakage current is decreased when the aluminum atomic concentration in a certain film is in a rage of $1 \times 10^{12}$ atoms/cm$^2$ to $1 \times 10^{16}$ atoms/cm$^2$.

The oxygen concentration of an aluminum oxide film and that of a silicon oxide film are different from each other. Therefore, when an aluminum oxide film and a silicon oxide film are adjacent to each other, oxygen ions tend to shift from a low concentration side to a high concentration side in order to relax the difference between the oxygen concentrations of these films. Such shifting of oxygen ions becomes a cause of generating an electric dipole. That is, a dipole is generated on an interface between an aluminum oxide film and a silicon oxide film due to the difference of the oxygen concentrations of these films.

The dipole modulates the energy band structure of an oxide film. To be more specific, a positive charge is arranged on an oxide film on an electron injection side, and a negative charge is arranged on an oxide film on a side opposite to the electron injection side. When a dipole is generated in this manner, an energy band is modulated so as to enlarge an energy barrier to electrons. Accordingly, the tunnel probability of electrons is lowered and the leakage current is decreased.

Therefore, as shown in FIG. 9A to FIG. 10, by inserting the aluminum oxide film 410, oxygen ions shift from the aluminum oxide film 410 to the silicon oxide films 401 and 406, or oxygen ions shift from the silicon oxynitride film 402 to the aluminum oxide film 410. With this configuration, a dipole is generated on respective interfaces and energy bands are modulated. As a result, the leakage current can be decreased.

The second modification can be combined with the first and second embodiments or the first modification. With the combination, the second modification can also obtain effects of the first and second embodiments or the first modification.

(Third Modification)

Figure 11:
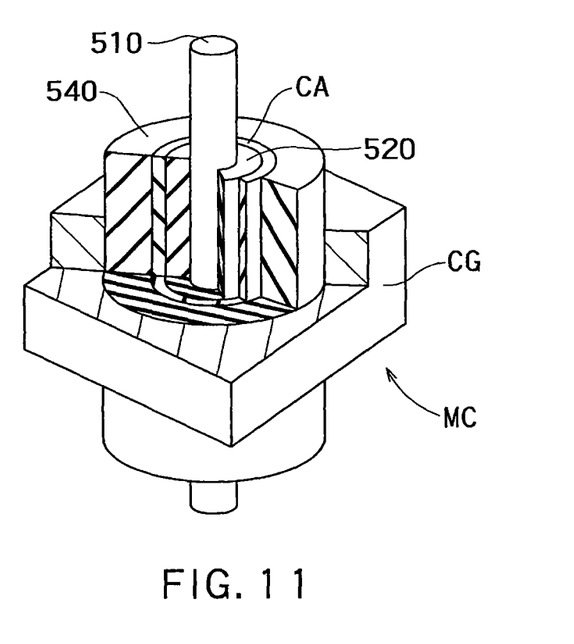
FIG. 11 shows an example of a configuration of a memory according to a third embodiment.

FIG. 11 shows an example of a configuration of a memory according to a third embodiment. The memory according to the first embodiment includes the two-dimensionally arranged memory area 1. Meanwhile, the memory according to the third embodiment includes a three-dimensional memory cell array.

For example, the memory cells MC includes a semiconductor pillar 510, a tunnel insulating film 520, the charge accumulation layer CA, an intermediate dielectric film 540, and the control gate CG.

For example, the semiconductor pillar 510 is formed using a semiconductor material such as silicon. The semiconductor pillar 510 is formed in a cylindrical manner, and is provided so as to penetrate through the center of the memory cells MC.

The tunnel insulating film 520 is provided around the semiconductor pillar 510 and is formed using, for example, an insulating film such as a silicon oxide film or a silicon oxynitride film. The charge accumulation layer CA is provided around the tunnel insulating film 520 and is formed using, for example, a silicon nitride film.

The intermediate dielectric film 540 is provided around the charge accumulation layer CA and is formed using, for example, a laminated film of a silicon oxide film, a silicon nitride film, and a silicon oxynitride film.

The control gate CG is, for example, provided around the intermediate dielectric film 540 and is formed using, for example, tungsten or a conductive material such as a tungsten nitride film.

Figure 12A:
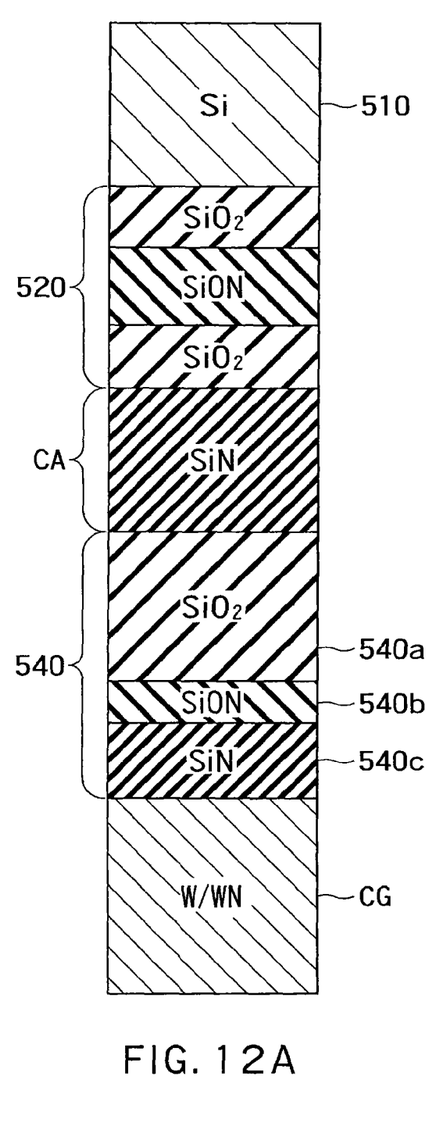
FIGS. 12A and 12B are schematic diagrams of a structure from the semiconductor pillar 510 to the control gate CG.
Figure 12B:
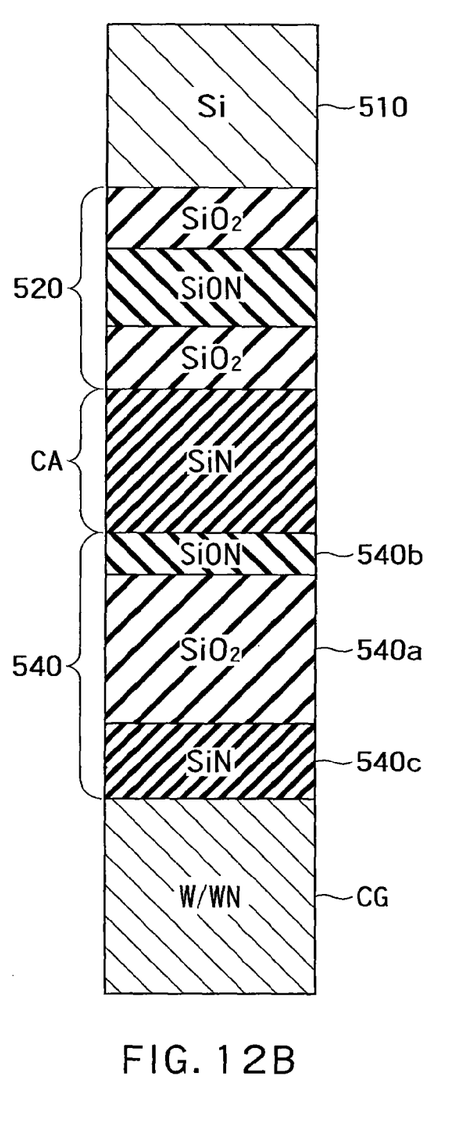

FIGS. 12A and 12B are schematic diagrams of a structure from the semiconductor pillar 510 to the control gate CG. The intermediate dielectric film 540 includes a silicon oxide film 540a, a silicon oxynitride film 540b, and a silicon nitride film 540c.

In the intermediate dielectric film 540 shown in FIG. 12A, the silicon oxide film 540a is provided around the charge accumulation layer CA. The silicon oxynitride film 540b is provided around the silicon oxide film 540a. The silicon nitride film 540c is provided around the silicon oxynitride film 540b. The control gate CG is provided around the silicon nitride film 540c. The configuration of the silicon oxynitride film 540b can be identical to that of the silicon oxynitride film 402 according to the first embodiment.

As the silicon oxynitride film 540b is provided between the silicon oxide film 540a and the silicon nitride film 540c, charge trapping in a data erasing operation can be suppressed. That is, in a data erasing operation, the silicon oxynitride film 540b can suppress leakage of charges from the control gate CG to the charge accumulation layer CA. Furthermore, because the nitrogen content Rn of the silicon oxynitride film 540b is equal to or lower than 0.52, it is possible to prevent the charges from being trapped in the silicon oxynitride film 540b itself.

In the intermediate dielectric film 540 shown in FIG. 12B, the silicon oxynitride film 540b is provided between the silicon oxide film 540a and the charge accumulation layer CA. Other parts of the configuration of the memory shown in FIG. 12B can be identical to corresponding ones of the configuration shown in FIG. 12A.

As the silicon oxynitride film 540b is provided between the silicon oxide film 540a and the charge accumulation layer CA, charge de-trapping in a data writing operation can be suppressed. That is, in a data writing operation, leakage or de-trapping of charges from the charge accumulation layer CA to the control gate CG can be suppressed.

The intermediate dielectric film 540 can have a configuration that is identical to that of any one of the intermediate dielectric film 40 according to the first embodiment, the second embodiment, the first modification, or the second modification. That is, the first and second embodiments and the first and second modifications can be easily applied to a three-dimensional memory. Accordingly, the memory according to the third embodiment can also obtain effects of any one of the first embodiment, the second embodiment, the first modification, or the second modification.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a semiconductor pillar;
a tunnel insulating film directly on a side surface of the semiconductor pillar;
a charge accumulation layer directly on a side surface of the tunnel insulating film;
an intermediate dielectric film directly on a side surface of the charge accumulation layer; and
a control gate electrode around the intermediate dielectric film, wherein
the intermediate dielectric film includes a laminated film of silicon oxide films of multiple layers, silicon nitride films of at least one layer, and a silicon oxynitride film,
and wherein an oxygen content of the silicon oxynitride film is CNTo and a nitrogen content of the silicon oxynitride film is CNTn, and the nitrogen content CNTn/(CNTo+CNTn) of the silicon oxynitride film decreases gradually or in a stepwise manner from the silicon nitride film adjacent to one side of the silicon oxynitride film to the silicon oxide film adjacent to the other side of the silicon oxynitride film.

2. The device of claim 1, wherein the nitrogen content CNTn/(CNTo+CNTn) is equal to or less than 0.52.

3. The device of claim 2, wherein the nitrogen content CNTn/(CNTo+CNTn) of the silicon oxynitride film decreases gradually or in a stepwise manner from the silicon nitride film adjacent to one side of the silicon oxynitride film to the silicon oxide film adjacent to the other side of the silicon oxynitride film.

4. The device of claim 2, wherein the nitrogen content CNTn/(CNTo+CNTn) of the silicon oxynitride film decreases gradually or in a stepwise manner as a position of the silicon oxynitride film becomes farther from the semiconductor substrate.

5. The device of claim 2, further comprising an interface between the silicon oxide film and the silicon oxynitride film, an interface between the silicon nitride film and the silicon oxynitride film, or a layer of an aluminum oxide film provided in the silicon oxynitride film.

6. The device of claim 1, wherein
when the silicon oxide films are denoted as "O" and the silicon nitride films are denoted as "N", the intermediate dielectric film includes an ONO film or an NONON film, and
the silicon oxynitride film is provided on any one of interfaces between "O" and "N" of the intermediate dielectric film.

7. The device of claim 2, wherein
when the silicon oxide films are denoted as "O" and the silicon nitride films are denoted as "N", the intermediate dielectric film includes an ONO film or an NONON film, and
the silicon oxynitride film is provided on any one of interfaces between "O" and "N" of the intermediate dielectric film.

* * * * *